(12) United States Patent
Michalik et al.

(10) Patent No.: US 10,065,855 B2
(45) Date of Patent: Sep. 4, 2018

(54) INTEGRATED CIRCUIT COMPRISING MULTI-LAYER MICROMECHANICAL STRUCTURES WITH IMPROVED MASS AND RELIABILITY BY USING MODIFIED VIAS AND METHOD FOR FORMING THE SAME

(71) Applicants: UNIVERSITAT POLITÈCNICA DE CATALUNYA, Barcelona (ES); Daniel Fernández Martínez, Pallejà (ES)

(72) Inventors: Piotr Jozef Michalik, Barcelona (ES); Daniel Fernández Martínez, Pallejà (ES); Jordi Madrenas Boadas, Barcelona (ES)

(73) Assignees: UNIVERISTAT POLITECNICA DE CATALUNYA, Barcelona (ES); Daniel Fernandez Martinez, Palleja (ES)

( * ) Notice: Subject to any disclaimer, the term of this patent is extended or adjusted under 35 U.S.C. 154(b) by 0 days.

(21) Appl. No.: 15/568,140

(22) PCT Filed: Apr. 20, 2016

(86) PCT No.: PCT/IB2016/000490
§ 371 (c)(1),
(2) Date: Oct. 20, 2017

(87) PCT Pub. No.: WO2016/170412
PCT Pub. Date: Oct. 27, 2016

(65) Prior Publication Data
US 2018/0148329 A1 May 31, 2018

(30) Foreign Application Priority Data
Apr. 21, 2015 (EP) ..................................... 15164506

(51) Int. Cl.
*B81C 1/00* (2006.01)
*B81B 3/00* (2006.01)
*B81B 7/00* (2006.01)

(52) U.S. Cl.
CPC ........ *B81C 1/00682* (2013.01); *B81B 3/0021* (2013.01); *B81B 3/0094* (2013.01);
(Continued)

(58) Field of Classification Search
None
See application file for complete search history.

(56) References Cited

U.S. PATENT DOCUMENTS

| 5,618,752 A | 4/1997 | Gaul |
| 2012/0280393 A1 | 11/2012 | Kaynak et al. |

(Continued)

FOREIGN PATENT DOCUMENTS

WO 2005061376 7/2005

OTHER PUBLICATIONS

Dai, Ching-Liang, et al. "A maskless wet etching silicon dioxide post-CMOS process and its application". Microelectronic engineering. 2006. vol. 83, No. 11, p. 2543-2550.

(Continued)

*Primary Examiner* — Alexander Ghyka

(57) ABSTRACT

An integrated circuit and the method to produce the integrated circuit comprising: a substrate (10); active devices (11); plurality of metal layers (17), wherein said metal layers are separated by dielectric layers (13) and connected to each other by plurality of vias (19); at least one micromechanical region (15) wherein some of the dielectric layers are removed leaving hollow spaces (23), thereby some of said metal and via layers form a micromechanical device in said micromechanical region, wherein said micromechanical device comprises at least one multi-layer structure (165) that is built of a plurality of metal layers and at least one via layer and said multi-layer structure is characterized by that at least two metal layers of said multi-layer structure are joined by at least one modified via (41).

12 Claims, 6 Drawing Sheets

(52) U.S. Cl.
CPC ........ *B81B 7/0006* (2013.01); *B81C 1/00142* (2013.01); *B81C 1/00301* (2013.01); *B81B 2201/0235* (2013.01); *B81B 2201/0242* (2013.01); *B81B 2203/0163* (2013.01)

(56) References Cited

U.S. PATENT DOCUMENTS

| | | | |
|---|---|---|---|
| 2012/0280781 A1* | 11/2012 | Smeys | H01F 17/0033 336/219 |
| 2013/0299924 A1 | 11/2013 | Weber et al. | |
| 2014/0225250 A1* | 8/2014 | Montanya Silvestre | B81C 1/00246 257/734 |
| 2015/0274506 A1* | 10/2015 | Feyh | F01D 15/10 257/416 |
| 2016/0046482 A1* | 2/2016 | Lin | G01P 15/0802 438/50 |
| 2016/0264410 A1* | 9/2016 | Brigham | B81B 3/0021 |
| 2017/0022048 A1* | 1/2017 | Jahnes | B81C 1/00476 |
| 2017/0066014 A1* | 3/2017 | Kidwell, Jr. | B06B 1/0292 |
| 2017/0260042 A1* | 9/2017 | Liu | B81B 7/0006 |

OTHER PUBLICATIONS

Fernández, Daniel, et al. "Experiments on the release of CMOS-micromachined metal layers". Journal of Sensors, 2010.

International Search report and written opinion of PCT/IB2016/000490 dated Aug. 9, 2016.

* cited by examiner

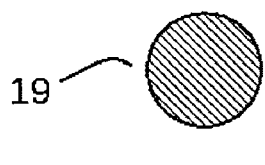
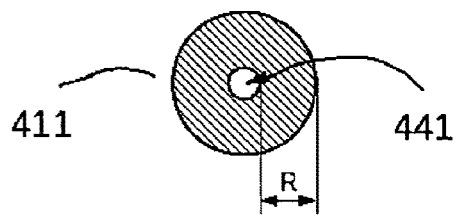
FIG. 6a    FIG. 6b
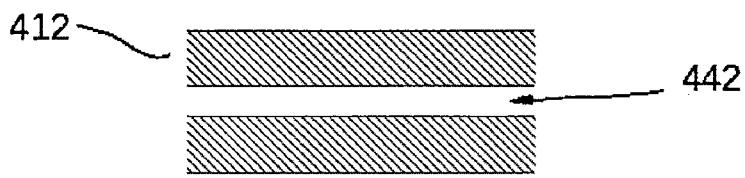
FIG. 6c
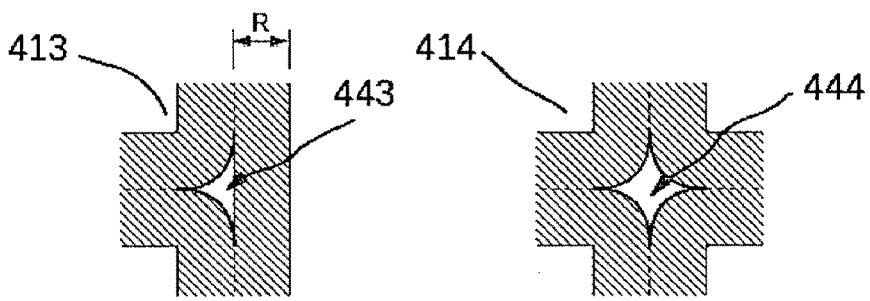
FIG. 6d    FIG. 6e
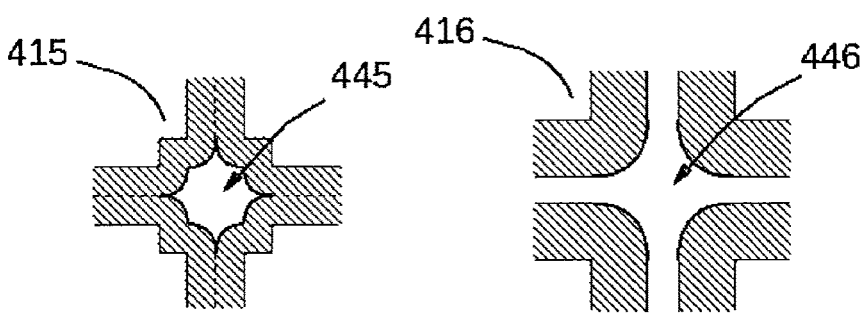
FIG. 6f    FIG. 6g

INTEGRATED CIRCUIT COMPRISING MULTI-LAYER MICROMECHANICAL STRUCTURES WITH IMPROVED MASS AND RELIABILITY BY USING MODIFIED VIAS AND METHOD FOR FORMING THE SAME

RELATED APPLICATIONS

This application is a US national phase application of international application number PCT/IB2016/000490, filed 20 Apr. 2016, which designates the US and claims priority to European application EP 15164506.6 filed 21 Apr. 2015, the contents of each of which are hereby incorporated by reference as if set forth in their entireties.

TECHNICAL FIELD

The invention is related to an integrated circuit comprising micromechanical structures; in particular of MEMS design (Micro Electro Mechanical System), which are produced in miniaturized fashion by means of thin-film methods compatible with integrated circuit process, and to the use of said component.

BACKGROUND ART

Integrated Circuit (IC) production process can be divided into two main stages. FEOL (Front-end of line) consists in a fabrication of active devices like transistors or diodes on a semiconductor substrate (typically silicon). BEOL (back-end of line) is the remaining part of IC fabrication process with a principal goal of creating the interconnections between the active devices. BEOL process generates a stack of subsequent metallization layers (typically Al, AlCu alloy or Cu) separated with IMD (inter-metal dielectric) (typically Silicon Dioxide) and vias which are small openings in the inter-metal dielectric that are filled with a conductor (for example Tungsten) in order to provide vertical connections from one metallization layer to another. In a typical IC technology vias have a fixed size optimized for minimum diameter providing reliable contact and wherever a lower via resistance is required a matrix of such vias is used. Furthermore in a technology with a plurality of metal and via layers, some via and metal layers deposited further from the substrate may have a higher thickness than those deposited closer to the substrate. Such an arrangement is typically used in order to provide lower global interconnection resistance or to build integrated inductors with improved quality factor. BEOL process is usually finished by a deposition of a passivation layer like Silicon Nitride that provides additional protection of an IC.

The paper of DAI, CHING-LIANG, et al.—"A maskless wet etching silicon dioxide post-CMOS process and its application" discloses a variety of micromechanical components monolithically integrated on a standard IC by means of freeing a part of the BEOL interconnection stack through IMD isotropic etching.

Such a technique, which is an example of BEOL micromachining, can provide a very cost-effective solution for the production of a variety of relatively small microelectromechanical elements like radio-frequency (RF) switches (for example US 20120280393 A1), filters or resonators. However so far, it has been less successful as a method of fabricating more bulky devices like accelerometers or gyroscopes.

Capacitive accelerometers or other inertial sensors require a relatively big mass and high sensing capacitance in order to translate an inertial movement to an electrical signal. For this reason they are usually made using a dedicated production process. Most of the attempts of using BEOL-micromachining for that purpose required several additional etching steps like reactive-ion-etching of the BEOL and/or substrate anisotropic or deep reactive-ion etching. These steps are disruptive for an IC production process and increase its cost. Also they impede micromechanical device integration on top of the integrated circuit.

The isotropic etching of IMD is a simple additional post-process consisting in insulator removal from a part of the integrated circuit interconnection stack, which results in obtaining hollow spaces between the interconnection layers, thereby some part of the interconnections form micromechanical structures. Such a process can be performed through wet or dry etching using any etchant that dissolves the inter-metal dielectric while is selective to the metallization and via layers. An example of an etchant that is used to remove silicon dioxide and is selective to aluminum is Silox Vapox III produced by Transene and used in DAI, CHING-LIANG, et al.—"A maskless wet etching silicon dioxide post-CMOS process and its application". Other examples can be found for example in FERNANDEZ, DANIEL, et al. "Experiments on the release of CMOS-micromachined metal layers." Journal of Sensors, 2010. If the etching is wet it is usually followed by critical-point drying process or by a rinse in a low surface tension liquid like isopropanol or methanol. These steps minimize stiction problems. The part of an IC that is a subject of etching can be selected by an opening in the passivation layer. Optionally a hard mask or photoresist can be used to protect the passivation.

The main difficulty in using the IMD isotropic etching to produce accelerometers, gyroscopes or other bulky micromechanical devices is the necessity of using several metallization layers in order to provide sufficiently big and thick mass and high sensing capacitance. The isotropic nature of the etching step leads however to a partial or total IMD removal from the space between the metallization layers depriving the micromechanical structures of the adhesive forces between the metal and IMD. In this case the remaining adhesive forces provided by standard vias may be insufficient to preserve micromechanical device integrity—the micromechanical device may get damaged due to residual stress, temperature change, mechanical shock or other phenomena.

US-A1-2013/299924 relates to a component system including at least one MEMS element, a cap for a micromechanical structure of the MEMS element, and at least one ASIC substrate. The micromechanical structure of the MEMS element is implemented in the functional layer of an SOI wafer. The MEMS element is mounted face down, with the structured functional layer on the ASIC substrate, and the cap is implemented in the substrate of the SOI wafer. The ASIC substrate includes a starting substrate provided with a layered structure on both sides. At least one circuit level is implemented in each case both in the MEMS-side layered structure and in the rear-side layered structure of the ASIC substrate. In the ASIC substrate, at least one ASIC through contact is implemented which electrically contacts at least one circuit level of the rear-side layered structure and/or at least one circuit level of the MEMS-side layered structure.

U.S. Pat. No. 5,618,752 discloses a surface mountable integrated circuit and a method of manufacture. A wafer has a die with an integrated circuit in one surface of the wafer. A via extends to the opposite surface. The via has a sidewall oxide and is filled with a conductive material such as metal or doped polysilicon. The metal may comprise a barrier layer and an adhesion layer. The second end of the via can be fashioned as a prong or a receptacle. Dies with vias can be stacked on top of each other or surface mounted to printed circuit boards or other substrate.

WO-A1-2005061376 discloses a method of enclosing a micromechnical element formed between a base Layer and one or more metallization layers. The method includes forming one or more encapsulating layers over the micromechanical element and providing an encapsulating wall surrounding the element extending between the base layer and the one or more encapsulating layers. An electrical connection is provided between the base layers, and the one or more metallisation layers formed above the micromechanical element.

DISCLOSURE OF THE INVENTION

The disclosed invention improves the reliability of a mechanical junction between joined metal layers in a metal stack exposed to IMD isotropic etching. The effect is reached by means of using modified via shaping that locally prevents the deposited via plug (for example Tungsten) to fill entirely the via opening leaving a void on some part of the via area. The metal layer deposited above the via fills the void, thereby the contact area between the via and the metal layer and the attachment force between these two layers are improved.

FIG. 1 presents a simplified cross-section of an IC comprising substrate 10, active devices 11, BEOL stack 12 further comprising passivation layer 14 metal layers 17, standard vias 19 and IMD 13, wherein a part of the interconnection stack forms a multi-layer micromechanical structure 16 that is going to be released by IMD isotropic etching applied through passivation layer opening 15.

FIG. 2 represents a simplified cross-section of same IC after performing the IMD isotropic etching process, which results in leaving hollow space 23 between some of the metal layers. The standard vias 19 within the multi-layer mechanical structure 162 are not capable of sustaining the residual stress of the released metal layers what results in disintegration of the multi-layer micromechanical structure 162.

In a conventional IC technology, vias are high-aspectratio, steep, openings in IMD that are filled with a conductor, for example a refractory metal like Tungsten deposited using CVD (Chemical Vapour Deposition) process. FIG. 3 represents a cross-section of a standard via 19 used to connect two metal layers 171 and 172 that comprise as an example the following sublayers: bottom Titaniun/Titanium Nitride layer 31, main AlCu layer 32 and top Titaniun/Titanium Nitride layer 33. Once the IMD layer 13 is finished a steep via opening is etched out and covered with a thin Titanium Nitride layer 35 which is a glue layer for the subsequent Tungsten CVD step. The CVD process selectively and gradually grows the Tungsten plug 37 over Titanium Nitride until it fills the via opening. The excess of Tungsten is removed and a next metal layer 172 is deposited using for example Physical Vapor Deposition or sputtering process.

The CVD process is usually optimized to guarantee proper fill (hence the electrical performance and reliability) of a via opening and the via opening has a diameter specific for a given technology and a metal layer. Neither smaller nor bigger via openings are guaranteed to be properly filled. For this reason the via size is fixed and changing its diameter or shape is considered as a design rule violation.

The inventors however have found an advantageous effect of via size rule violation when is used in the MEMS part of an integrated circuit. FIG. 4 represents a simplified cross-section of a modified via 41 around a point where its diameter is extended. The CVD process grows over the Titanium Nitride layer 35 a Tungsten layer 37 of thickness R, which is a value typically slightly bigger than a radius of the standard via 19. Since the radius of the modified via is bigger than R, the via opening is not filled entirely and a void 44 is left in the centre of the via. If the void is sufficiently big, it is partially or entirely filled during the next step of metal layer deposition resulting in a vertical extension 45 of the metal layer. Such a construction of the via, although may lack optimal electrical properties, features superior mechanical performance in comparison to the standard vias 19, when the IMD layer 13 is removed.

A bigger via extension over the standard radius R provides better metal fill of the via void, however it intensifies local metal planarity degeneration 47, that may propagate to subsequent metal layers. Therefore the preferred amount of the via size extension should be determined experimentally for a particular case or if the process data is available—through numerical simulations.

The electrical contact reliability and performance of the remaining part of the IC is not compromised, as the fabrication process can remain unchanged and standard design rules can be kept outside the MEMS area. Therefore no costly BEOL process redesign and requalification is required.

BRIEF DESCRIPTION OF THE DRAWINGS

FIGS. 6a to 6g are top views of vias in different embodiments of the invention.

DETAILED DESCRIPTION OF EMBODIMENTS

Figure 1:
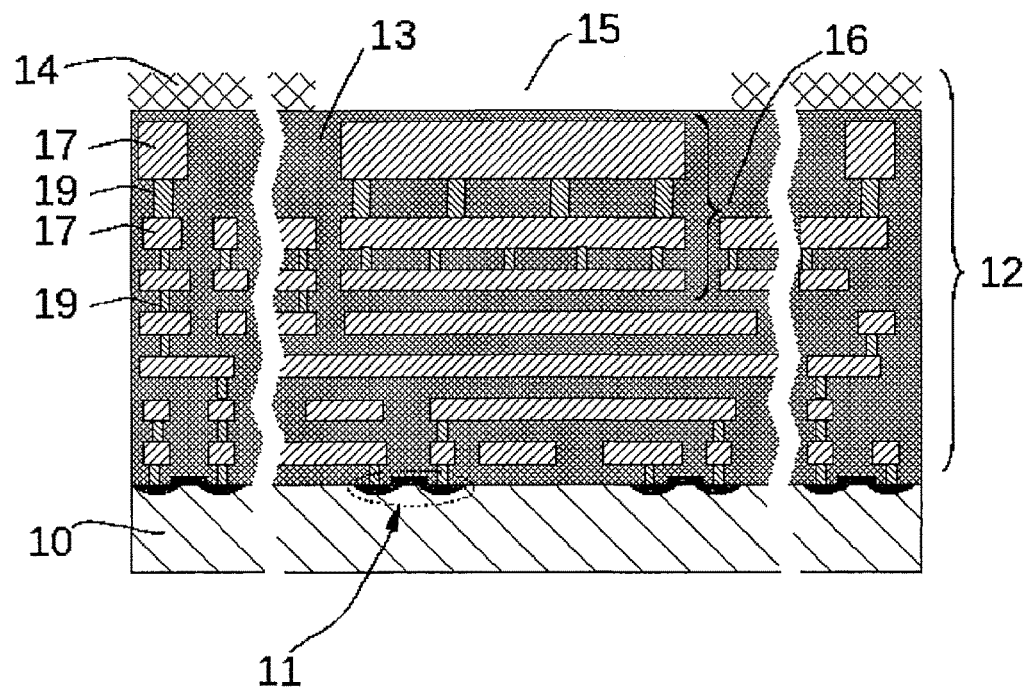
FIG. 1 is a pre-etching cross-section view of an integrated circuit comprising a multi-layer micromechanical component wherein different metal layers are joined using standard-size vias.
Figure 2:
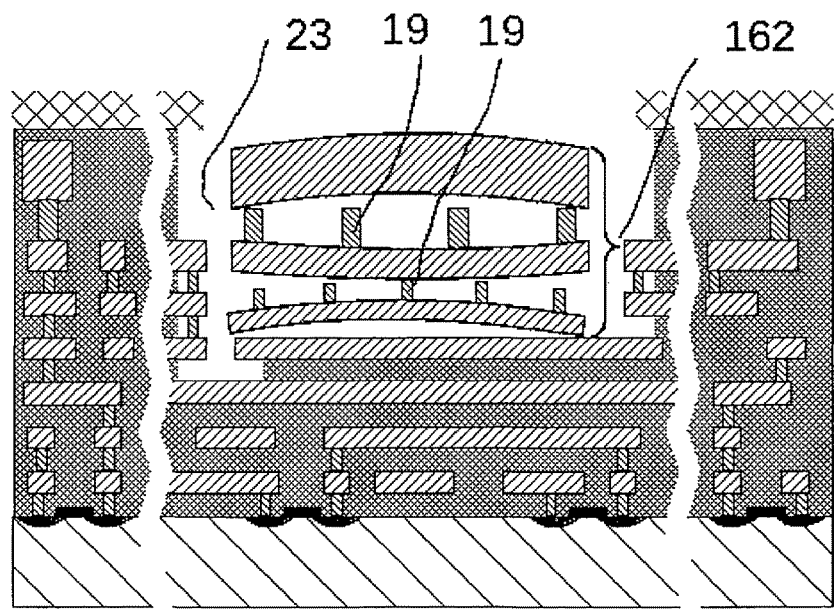
FIG. 2 is a post-etching cross-section view of the integrated circuit from FIG. 1, where the multi-layer micromechanical component suffers decomposition due to insufficient attaching force provided by standard vias.
Figure 3:
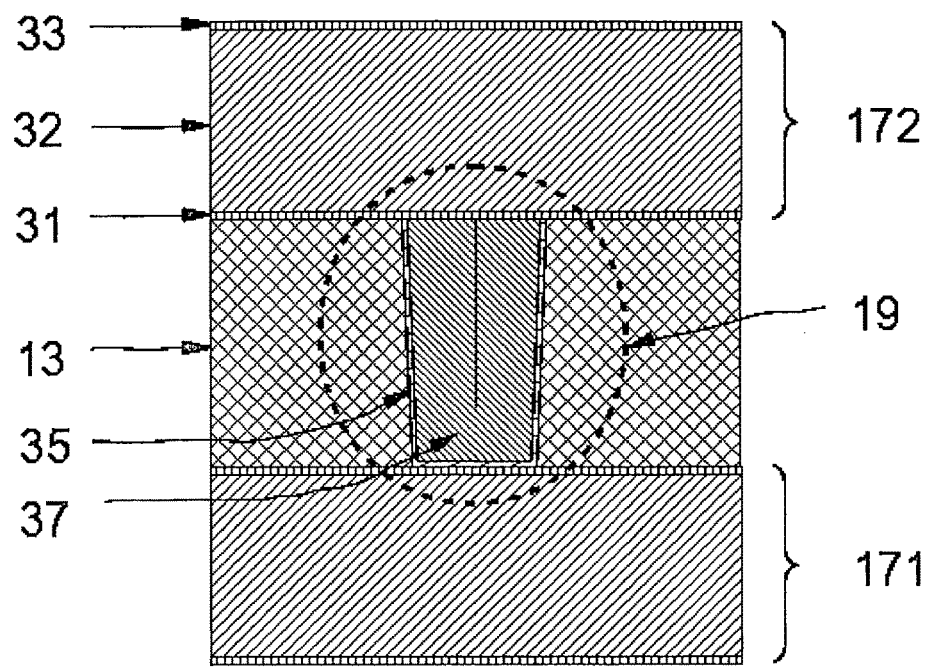
FIG. 3 is a detailed cross-section view of a standard via.
Figure 4:
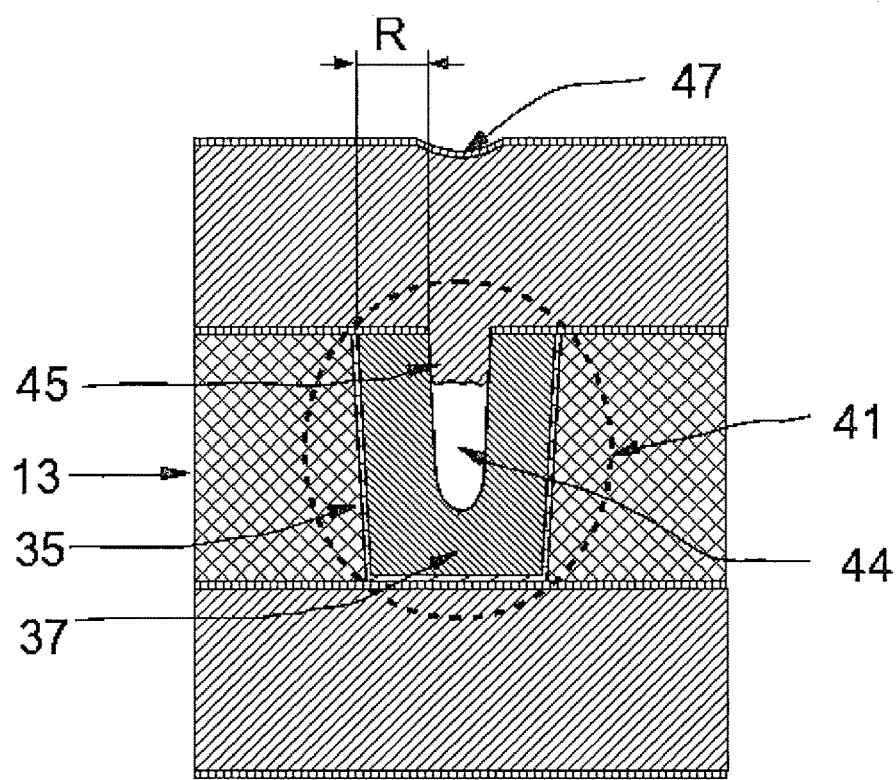
FIG. 4 is a detailed cross-section view of a modified via.
Figure 5:
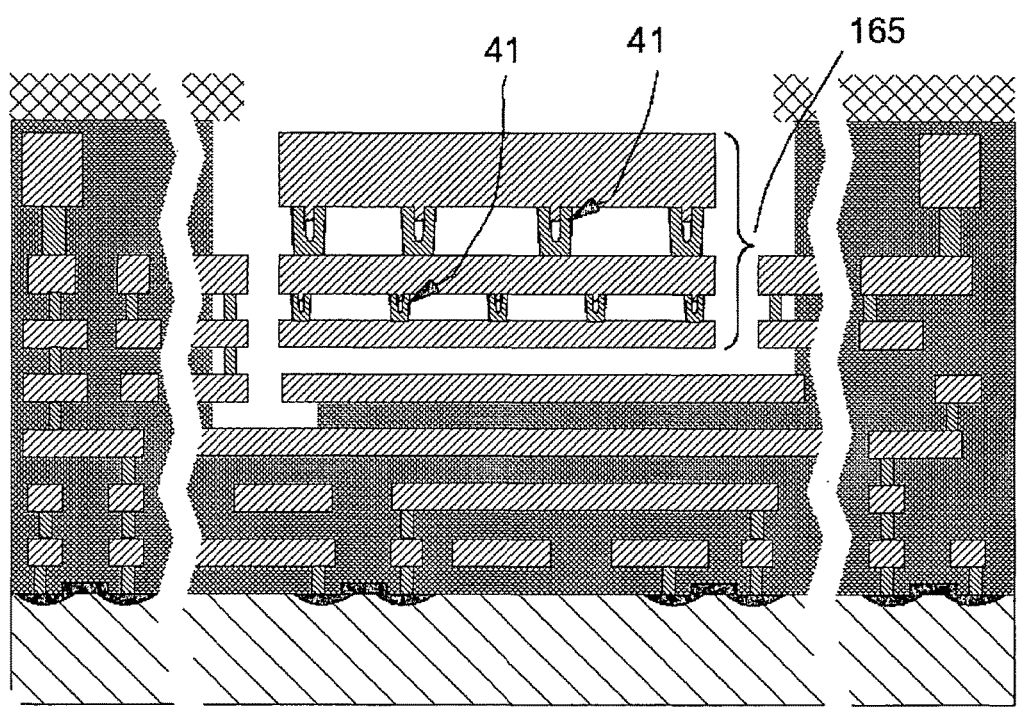
FIG. 5 is a post-etching cross-section view of the integrated with multi-layer micromechanical structure comprising modified vias.

FIG. 5 represents a simplified cross-section of an integrated circuit with a multi-layer micromechanical structure 165 comprising modified vias 41. The modified vias are capable to resist the residual stress of the metal layers, so that the micromechanical structure 165 preserves its integrity. The multi-layer micromechanical structure 165 presented in the figure uses three metal and two via layers, however the invention neither specifies a particular number layers that are stuck nor the thickness of the stacked via and metal layers.

FIGS. 6a-6g reveal a variety of via shapes seen from the top. The CVD process deposits a Tungsten within a radius R from the via perimeter. For the sake of clarity it is assumed that R is equal to half-size of a standard via 19, however in some technologies R can be bigger. Increasing the diameter of a standard via leads to a modified via of a first type 411 with a void 441 located in the centre of the via 411.

Another type of a modified via structure can be obtained by stretching the via with increased diameter along one axis in order to obtain a widen via bar 412 with a void that takes a shape of trench 442.

Yet another embodiment of modified via 413 is obtained by joining two via bars of standard width, generating a void 443 in the via bar junction area. Similarly a crossing 414 of two standard width via bars can generate a void 444 in the centre of the crossing. The angle at which the via bars cross or join each other does not have to be 90 degree as in FIGS. 6*d* and 6*e*, although in some IC technologies other angles may be forbidden.

In some cases a void diameter obtained by a via bar crossing or junction may be insufficient to guarantee enough metal deposition depth inside the void. In such case the void size can be increased 445 by locally increasing the via diameter 415 around the point of the via bar crossing or junction.

Crossing 416 of two via bars of extended width is yet another embodiment of the invention. In this case the void 446 in the via takes shape of two crossed trenches having increased diameter in the centre of the crossing.

In order to teach better the invention, in FIGS. 7*a*-7*d* exploded views of metal-via-metal cantilevers using different shapes of modified vias are presented.

Figures 7A, 7B:
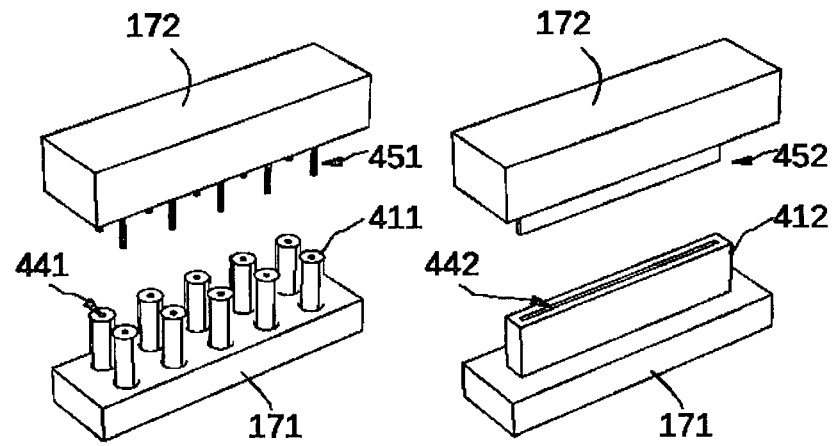
FIGS. 7a to 7d are exploded views of multi-layer cantilevers comprising different modified via types.

The first exemplary cantilever presented in FIG. 7*a* comprises bottom metal layer 171 with a matrix of vias of extended diameter 411 that have voids 441 in the centres of vias 411 that are partially filled with the top metal layer 172 forming pin-shaped vertical metal extensions 451 that are stuck inside the voids 441.

The second exemplary cantilever presented in FIG. 7*b* comprises bottom metal layer 171 with a via bar of extended width 412 with a trench-shaped void 442, that is partially filled with the top metal layer 172 forming a wedge-shaped vertical metal extension 452 that is stuck inside the void 442.

Figures 7C, 7D:
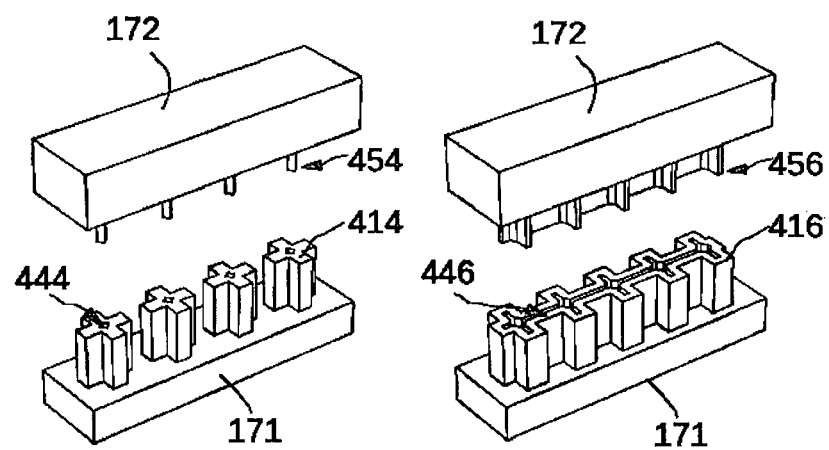

The third exemplary cantilever presented in FIG. 7*c* comprises a bottom metal layer 171 with several via crossings of standard diameter 414 wherein voids 444 are formed in the centres of the crossings and are partially filled with the top metal layer 172 forming pin-shaped vertical metal extensions 454 that are stuck inside the void 444.

The fourth exemplary cantilever presented in FIG. 7*d* comprises a bottom metal layer 171 with the modified via 416 arranged as a bar of extended width crossed with several other via bars of extended width, wherein the via void 446 having a shape of a trench crossed with several other trenches is partially filled by a metal structure of corresponding shape 456 and said metal structure is stuck inside the void 446.

The invention is not limited to the geometries presented in FIGS. 6*a*-6*g* and FIGS. 7*a*-7*d*. The invention in general view reveals a method to obtain a via void and vertical metal extension of a particular shape stuck inside the via void, by taking advantage of the fact that in a standard Tungsten via CVD process, the material is deposited towards entire height of the via only in the area that is within a technology-specific distance R from the via perimeter, while the via area that is more distant to the via perimeter is not entirely filled and in that area the void, that can be filled by the subsequent metal layer, is created. The via geometries presented in FIGS. 6*a*-6*g* and FIGS. 7*a*-7*d* form a general guideline to obtain other modified vias of desired and possibly more complex shapes that could result in other embodiments of the invention. Also any combination or arrangement of the via geometries presented in FIGS. 6*a*-6*g* and FIGS. 7*a*-7*d* would produce yet another embodiment of the invention.

The presented method of obtaining modified via shapes is a convenient method that is compatible with standard IC production process and does not require its modification. However a person skilled in the art may develop a different process to obtain similar shapes of vias and vertical metal extensions using different materials than Tungsten and AlCu alloy. Furthermore one could also deposit a via of extended size with another process that does not generate desired void in the via and then pattern the void using a dedicated etching step obtaining in the end a modified via and multi-layer microstructure with similar characteristics.

Figure 8A:
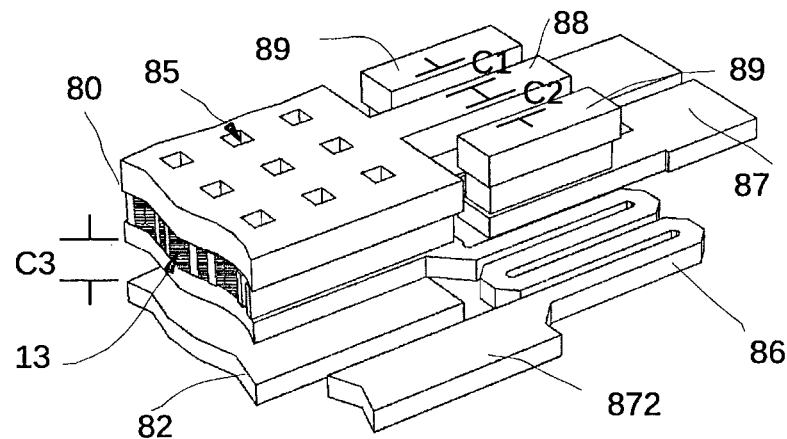
FIGS. 8a, 8b are isometric and exploded views of in-plane/out-of-plane capacitive transducer section comprising multi-layer metal structures joined by via mesh.
Figure 8B:
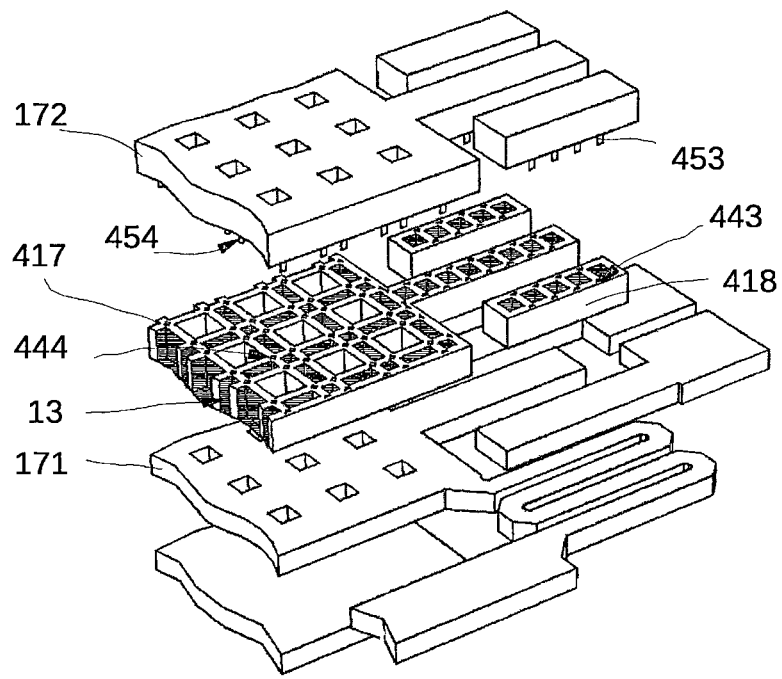

Another exemplary application of modified vias can be seen in FIGS. 8*a* and 8*b*, where a section of a capacitive transducer that can move in-plane and out-of-plane is depicted. Such a microstructure can be a building block of a multi-axis inertial sensor such as accelerometer, gyroscope or a combination of both.

A multi-layer mass 80 is suspended using springs 86 attached to the anchor 872 which is supported on the substrate (not shown). The mass further comprises plurality rotor fingers 88 that are placed between two stator fingers 89 attached to the substrate by anchors 87. For the sake of clarity only one rotor and only two stator fingers are drawn.

The multi-layer mass can be electrically coupled to an electronic circuit arranged at least partially from the active devices on the same substrate, so that the electronic circuit converts the mass position into an electrical signal or by applying a proper electronic signal the circuit can change the position of the mass. For example, by coupling to an electronic circuit, capacitances C1 and C2 between the stator and rotor fingers can be used to sense the horizontal position of the device or can be used to generate electrostatic force that modifies the horizontal position. Similarly the vertical position can be sensed through the capacitance C3 between the multi-layer suspended 80 mass and the bottom fixed plate 82 placed under the suspended multilayer mass 80 and fixed to the substrate.

The multi-layer mass 80 as well as the fingers 88 and 89 are composed of top metal layer 172, via meshes 417 and 418 and bottom metal layer 171. Furthermore via meshes 417 and 418 may enclose a part of IMD 13. Holes 85 facilitate the IMD removal between the multi-layer mass 80 and bottom fixed plate 82.

The via meshes 417 and 418 provide excellent attachment of the metal 172 deposited over the mesh, by generating voids 443 and 444 on the mesh nodes that are partially filled by the metal 172 deposited over the mesh producing pin-shaped vertical metal extensions 453 and 454 that are stuck inside the voids 443 and 444 respectively. In the presented example two-metal-layer structures with modified vias are used, however the concept can be extended to more metal layers.

Furthermore using the via mesh built of Tungsten or another high-density material is a very convenient way of producing microstructures that have much higher overall density than those made mainly from light metals like aluminium or aluminium-copper alloy used to produce interconnection layers. Therefore multi-layer microstructures comprising via meshes are especially predestined to be employed as proof masses of inertial sensors. The via mesh may also protect some part of the IMD 13 from being removed during the etching, what improves even more the overall device density and attachment forces between the layers.

Yet another advantageous feature of via meshes is that a via layer of such shape contribute to the overall lateral capacitance (like C1 and C2) better than would standard vias do and almost as well as the metal layers it joins, therefore it improves a potential device lateral capacitive sensing and actuating performance.

The presented method of obtaining the modified via shapes as well as its application to develop multi-layer microstructures is especially advantageous in case of IC technologies that provide thick metal layers in within the BEOL stack. The vias used to connect thick metal layers tend to usually have also higher thickness and bigger diameter than vias used to connect normal metal layers. Therefore combining multi-layer structures comprising thick metal layers and thick vias is a very convenient way to build bulky micromechanical devices like accelerometers or gyroscopes, as it provides high mass to area ratio and a high lateral capacitance.

The inventors noticed that multi-layer structures comprising thick metal layers and vias with nominal size are even more likely to suffer disintegration after the IMD etching process, than the structures using standard-thickness metal and via layers. On the other hand applying any of the presented techniques to a via with a bigger nominal diameter, like those used for thick metal layers, generates a shape with a higher void diameter, which is filled better by the metal. Furthermore thick metals are less likely to exhibit severe local metal planarity degeneration 47.

CITATION LIST OF REFERENCES

US 20120280393 A1
DAI, CHING-LIANG, et al. A maskless wet etching silicon dioxide post-CMOS process and its application. *Microelectronic engineering*. 2006, vol. 83, no. 11, p. 2543-2550.
FERNÁNDEZ, DANIEL, et al. Experiments on the release of CMOS-micromachined metal layers. *Journal of Sensors*. 2010.

The invention claimed is:
1. An integrated circuit comprising:
    a substrate (10);
    active devices (11);
    a plurality of metal layers (17), wherein said metal layers are separated by dielectric layers (13) and connected to each other by a plurality of vias (19); and
    at least one micromechanical region (15) wherein some of the dielectric layers are removed leaving hollow spaces (23), thereby some of said metal and via layers form a micromechanical device in said micromechanical region,
    wherein said micromechanical device comprises at least one multi-layer structure (165) that is built of a plurality of metal and at least one via layer,
wherein at least two metal layers of said multi-layer structure (165) are joined by at least one modified via (41) comprising a void space (44), wherein said void space is at least partially filled by the metal layer situated on top of said modified via,
wherein the void space is situated in the part of the area of the via that is substantially distant from a via opening perimeter (35), and
wherein in the at least one modified via (41), an area of the via that is substantially distant from the via opening perimeter (35) specifically occurs at a cross (414) or junction (413) of at least two via bars.

2. The integrated circuit according to claim 1, wherein some of the via bars are arranged in a form of mesh (417, 418).

3. The integrated circuit according to claim 1, wherein the multi-layer structure (165) contains at least one metal layer that is thicker than other metal layers.

4. The integrated circuit according to claim 1, wherein at least one multi-layer structure (165) is arranged as a part of movable mass electrically coupled to an electronic circuit and said electronic circuit is at least partially arranged from the active devices at the same substrate, thereby said electronic circuit converts a position of said mass with respect to the substrate into an electrical signal and/or said electronic circuit changes the position of the mass with respect to the substrate by applying a proper electrical signal.

5. The integrated circuit according to claim 4, wherein the movable mass is a part of an acceleration sensor, gyroscope or their combination.

6. The integrated circuit according to claim 1 wherein some of the active devices are situated under the micromechanical region (15).

7. A method of manufacturing of an integrated circuit comprising a substrate, at least one micromechanical region (15) with at least one multilayer structure (165), the method including:
    producing active devices (11) on the substrate (10);
    patterning and depositing metals (17), vias (19) and inter-metal dielectric (IMD) layers (13);
    removing the sacrificial part of IMD layers within the micromechanical regions, thereby creating hollow spaces (23),
wherein in the micromechanical regions, the via deposition process does not fill entirely the parts of at least a modified via (41) said parts being substantially distant from a via opening perimeter (35), thereby producing voids (44) in said vias, so that the subsequent metal deposition at least partially fills the void with the subsequent metal layer, thereby producing vertical extension (45) of said subsequent metal layer towards the void (44) in the modified via (41), and
wherein in the at least one modified via (41), the area of the via that is substantially distant from the via opening perimeter (35) specifically occurs at a cross (414) or junction (413) of at least two via bars.

8. The method according to claim 7, wherein the modified vias (41) are produced using chemical vapour deposition process.

9. The method according to claim 7, wherein the vias contain Tungsten or any Tungsten alloy.

10. The method according to claim 7, wherein the dielectric layer is removed from a micromechanical region by means of wet or dry isotropic etching.

11. The method according to claim 7, wherein the dielectric layers contain silicon dioxide.

12. The method according to claim 7, wherein the metal layers contain Aluminum or Copper or Aluminum-Copper alloy.

* * * * *